United States Patent
Xie et al.

(10) Patent No.: US 9,058,980 B1
(45) Date of Patent: Jun. 16, 2015

(54) UV-ASSISTED PHOTOCHEMICAL VAPOR DEPOSITION FOR DAMAGED LOW K FILMS PORE SEALING

(71) Applicant: Applied Materials, Inc., Santa Clara, CA (US)

(72) Inventors: Bo Xie, San Jose, CA (US); Kelvin Chan, San Ramon, CA (US); Alexandros T. Demos, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/098,428

(22) Filed: Dec. 5, 2013

(51) Int. Cl.
  *H01L 21/02* (2006.01)
(52) U.S. Cl.
  CPC .... *H01L 21/02118* (2013.01); *H01L 21/02277* (2013.01); *H01L 21/02348* (2013.01)
(58) Field of Classification Search
  USPC ................................................ 438/758, 780
  See application file for complete search history.

(56) References Cited

U.S. PATENT DOCUMENTS

| | | | |
|---|---|---|---|
| 7,678,682 B2 | 3/2010 | Waldfried et al. | |
| 8,535,767 B1 | 9/2013 | Kimura | |
| 2006/0105566 A1 | 5/2006 | Waldfried et al. | |
| 2006/0172531 A1 | 8/2006 | Lin et al. | |
| 2009/0325381 A1* | 12/2009 | Chan et al. | 438/675 |
| 2011/0117678 A1 | 5/2011 | Varadarajan et al. | |
| 2011/0159202 A1 | 6/2011 | Matsushita et al. | |
| 2011/0217838 A1* | 9/2011 | Hsieh et al. | 438/618 |
| 2012/0132618 A1 | 5/2012 | Baluja et al. | |

FOREIGN PATENT DOCUMENTS

JP   2009152402 A   7/2009

OTHER PUBLICATIONS

International Search Report and Written Opinion for International Application No. PCT/US2014/064418 dated Jan. 29, 2015.

* cited by examiner

*Primary Examiner* — Mamadou Diallo
(74) *Attorney, Agent, or Firm* — Patterson & Sheridan, LLP (57) ABSTRACT

Embodiments of the invention generally provide methods for sealing pores at a surface of a dielectric layer formed on a substrate. In one embodiment, the method includes exposing a dielectric layer formed on a substrate to a first pore sealing agent, wherein the first pore sealing agent contains a compound with a general formula $C_xH_yO_z$, where x has a range of between 1 and 15, y has a range of between 2 and 22, and z has a range of between 1 and 3, and exposing the substrate to UV radiation in an atmosphere of the first pore sealing agent to form a first sealing layer on the dielectric layer.

18 Claims, 4 Drawing Sheets

UV-ASSISTED PHOTOCHEMICAL VAPOR DEPOSITION FOR DAMAGED LOW K FILMS PORE SEALING

BACKGROUND

1. Field

Embodiments of the invention generally relate to methods for pore sealing of a damaged low-k film using a UV-assisted photochemical vapor deposition process.

2. Description of the Related Art

Semiconductor devices include metal layers that are insulated from each other by dielectric layers. As device features shrink, reducing the distance between the metal layers and between metal lines on each layer, capacitance increases. To address this problem, new insulating materials that have a relatively low dielectric constant are being used in place of silicon dioxide to form the dielectric layer that separates the metal lines. An exemplary material that may be used to form such a low-k dielectric layer is porous carbon doped oxide (CDO). Using this material instead of silicon dioxide to separate metal lines can yield a device having reduced propagation delay, cross-talk noise and power dissipation.

Porous carbon-doped oxides achieve lower dielectric constants through the incorporation of non-polar covalent bonds (e.g., from the addition of carbon) and the introduction of porosity to decrease film density. Introducing porosity or the incorporation of terminal bonds, such as Si—$CH_3$, breaks the continuity of the rigid Si—O—Si lattice of oxides, yielding a lower dielectric constant layer that is both mechanically and chemically weaker. Because of the mechanical weakness, porous carbon-doped oxides are susceptible to process-related damages and contamination caused by plasma ashing, and other processes in the wire machining process such as a back-end-of-line (BEOL) process. The effective dielectric constant for the low-k dielectric layer rises accordingly.

Therefore, there is a need in the art for an improved method which minimizes process-related damages and seals the exposed pores prior to further processing so that the dielectric constant of the low-k film can be restored.

SUMMARY OF THE INVENTION

Embodiments described herein generally relate to methods for pore sealing of a damaged low-k film using a UV-assisted photochemical vapor deposition process. In one embodiment, a method for sealing pores at a surface of a dielectric layer formed on a substrate within a processing chamber is provided. The method includes exposing a dielectric layer formed on a substrate to a first pore sealing agent, wherein the first pore sealing agent contains a compound with a general formula $C_xH_yO_z$, where x has a range of between 1 and 15, y has a range of between 2 and 22, and z has a range of between 1 and 3, and exposing the substrate to UV radiation in an atmosphere of the first pore sealing agent to form a first sealing layer on the dielectric layer.

In another embodiment, a method for sealing pores at a surface of a dielectric layer formed on a substrate within a processing chamber is provided. The method includes flowing a first pore sealing agent into an upper processing region of a processing chamber, the upper processing region located between a transparent window and a transparent showerhead positioned within the processing chamber, flowing the first pore sealing agent through one or more passages formed in the transparent showerhead and into a lower processing region, the lower processing region located between the transparent showerhead and a substrate support located within the thermal processing chamber, exposing a dielectric layer formed on a substrate to the first pore sealing agent, and exposing the substrate to UV radiation in an atmosphere of the first pore sealing agent to form a sealing layer on the dielectric layer.

In yet another embodiment, a method for sealing pores at a surface of a dielectric layer formed on a substrate within a processing chamber is provided. The method includes exposing a dielectric layer formed on a substrate to a first pore sealing agent, exposing the dielectric layer to a second pore sealing agent that is different from the first pore sealing agent, wherein the first and second pore sealing agents comprise a compound selected from the group consisting of dialkyl carbonates and alkyl acetates, and exposing the substrate to UV radiation in an atmosphere of the first and/or second pore sealing agents to form a sealing layer on the dielectric layer.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein generally relate to methods for pore sealing of a damaged low-k film using a UV-assisted photochemical vapor deposition process. During the pore sealing process, a gaseous or vaporized pore sealing agent is introduced into a processing chamber along with a carrier gas such as He or Ar. The UV lamp is then used to activate the pore sealing agent and form a thin layer on the porous low-k dielectric layer. The thin layer seals the exposed pores on the low-k dielectric layer and therefore lowers the dielectric constant of the low-k dielectric layer. In various embodiments, the pore sealing agent may contain a compound with a general formula $C_xH_yO_z$, where x has a range of between 1 and 15, y has a range of between 2 and 22, and z has a range of between 1 and 3. Various embodiments of the invention are discussed below in more detail.

Exemplary Processing Chamber

Figure 1:
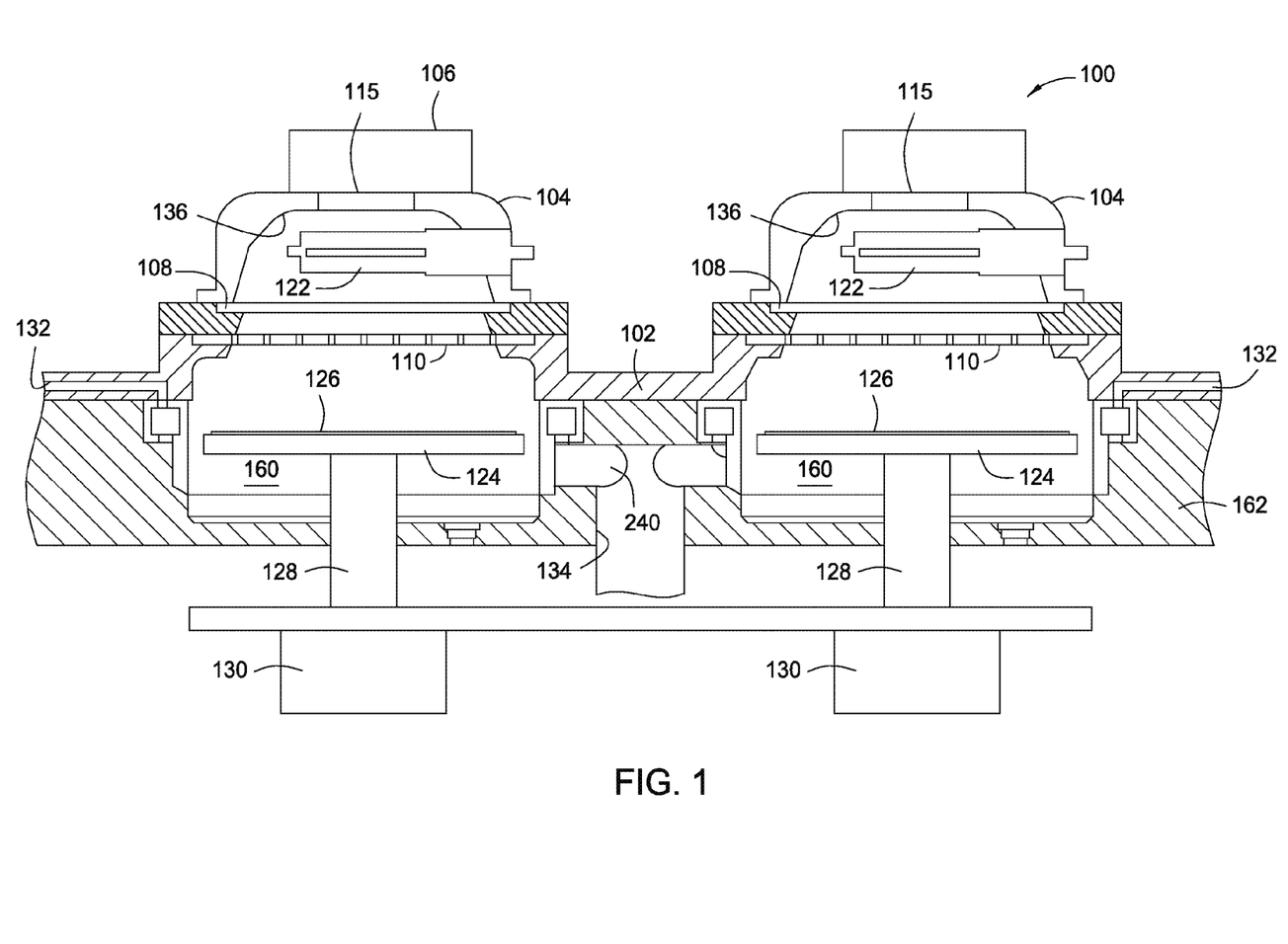
FIG. 1 is a partial cross-sectional section view of a tandem processing chamber that has a lid assembly with two UV bulbs disposed respectively above two processing regions.

FIG. 1 illustrates a cross-sectional view of an exemplary tandem processing chamber 100 that may be used to benefit the present invention. The processing chamber 100 provides two separate and adjacent processing regions in a chamber body for processing the substrates. The processing chamber 100 has a lid 102, housings 104 and power sources 106. Each of the housings 104 cover a respective one of two UV lamp bulbs 122 disposed respectively above two processing regions 160 defined within the body 162. Each of the processing regions 160 includes a heating substrate support, such as substrate support 124, for supporting a substrate 126 within the processing regions 160. The UV lamp bulbs 122 emit UV light that is directed through the windows 108 and showerheads 110 onto each substrate located within each processing region. The substrate supports 124 can be made from ceramic or metal such as aluminum. The substrate supports 124 may couple to stems 128 that extend through a bottom of the body 162 and are operated by drive systems 130 to move the substrate supports 124 in the processing regions 160 toward and away from the UV lamp bulbs 122. The drive systems 130 can also rotate and/or translate the substrate supports 124 during curing to further enhance uniformity of substrate illumination. The exemplary tandem processing chamber 100 may be incorporated into a processing system, such as a Producer™ processing system, commercially available from Applied Materials, Inc., of Santa Clara, Calif.

The UV lamp bulbs 122 can be an array of light emitting diodes or bulbs utilizing any of the state of the art UV illumination sources including, but not limited to, microwave arcs, radio frequency filament (capacitively coupled plasma) and inductively coupled plasma (ICP) lamps. The UV light can be pulsed during a cure process. Various concepts for enhancing uniformity of substrate illumination include use of lamp arrays which can also be used to vary wavelength distribution of incident light, relative motion of the substrate and lamp head including rotation and periodic translation (sweeping), and real-time modification of lamp reflector shape and/or position. The UV bulbs are a source of ultraviolet radiation, and may transmit a broad spectral range of wavelengths of UV and infrared (IR) radiation.

The UV lamp bulbs 122 may emit light across a broad band of wavelengths from 170 nm to 400 nm. The gases selected for use within the UV lamp bulbs 122 can determine the wavelengths emitted. UV light emitted from the UV lamp bulbs 122 enters the processing regions 160 by passing through windows 108 and gas distribution showerheads 110 disposed in apertures in the lid 102. The windows 108 may be made of an OH free synthetic quartz glass and have sufficient thickness to maintain vacuum without cracking. The windows 108 may be fused silica that transmits UV light down to approximately 150 nm. The showerheads 110 may be made of transparent materials such as quartz or sapphire and positioned between the windows 108 and the substrate support 124. Since the lid 102 seals to the body 162 and the windows 108 are sealed to the lid 102, the processing regions 160 provide volumes capable of maintaining pressures from approximately 1 Torr to approximately 650 Torr. Processing or cleaning gases may enter the processing regions 160 via a respective one of two inlet passages 132. The processing or cleaning gases then exit the processing regions 160 via a common outlet port 134.

Each of the housings 104 includes an aperture 115 adjacent the power sources 106. The housings 104 may include an interior parabolic surface defined by a cast quartz lining 136 coated with a dichroic film. The dichroic film usually constitutes a periodic multilayer film composed of diverse dielectric materials having alternating high and low refractive index. Therefore, the quartz linings 136 may transmit infrared light and reflect UV light emitted from the UV lamp bulbs 122. The quartz linings 136 may adjust to better suit each process or task by moving and changing the shape of the interior parabolic surface.

Figure 2:
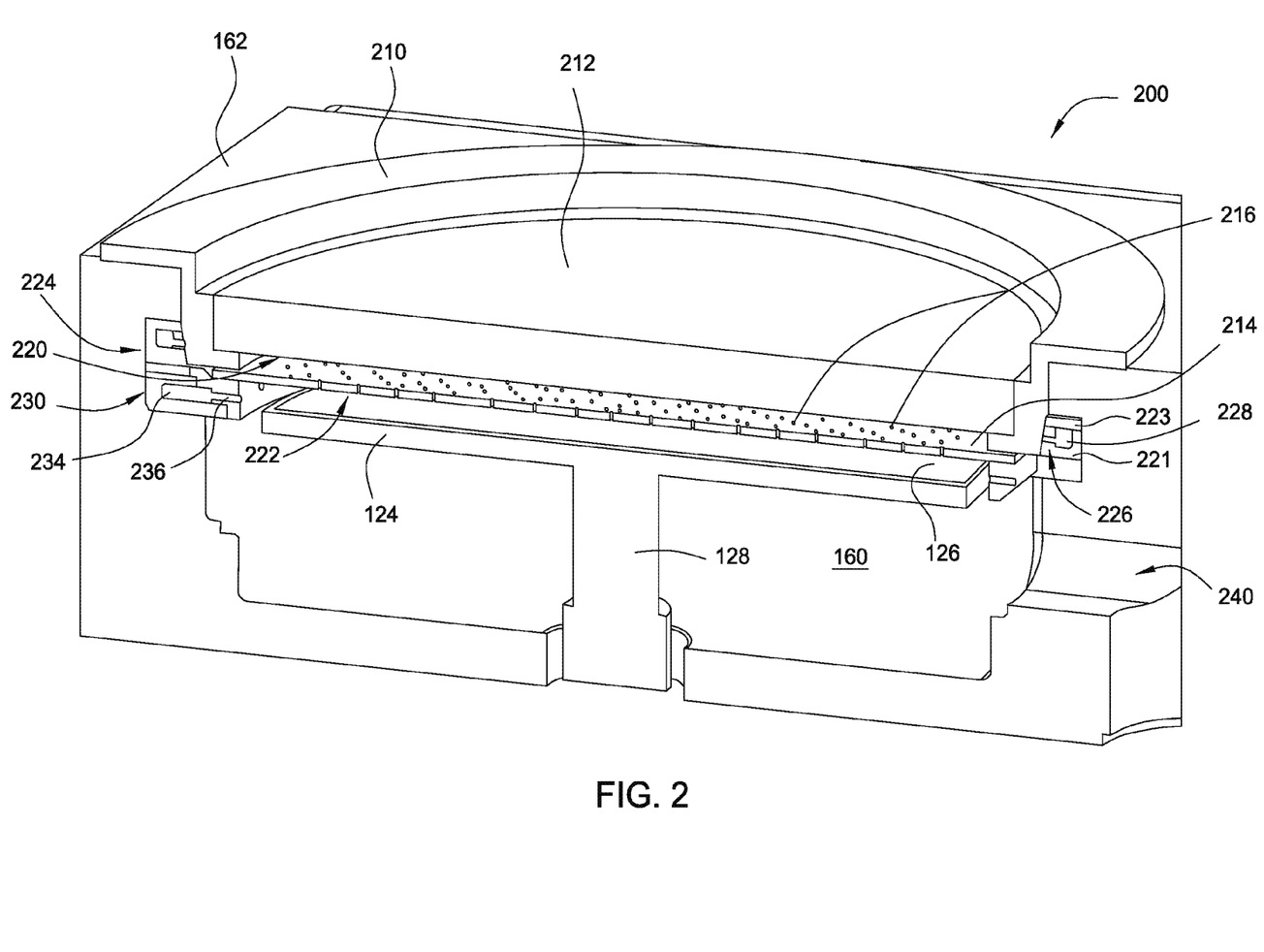
FIG. 2 is a schematic isometric cross-sectional view of a portion of one of the processing chambers without the lid assembly.

FIG. 2 shows a schematic isometric cross-sectional view of a portion of one of the processing chambers 200, which may be used alone, or in place of any of the processing region of the tandem processing chamber 100. The design of hardware shown in FIG. 2 enables a specific gas flow profile distribution across the substrate 126 being processed in a UV chamber, lamp heated chamber, or other chamber where light energy is used to process a film or catalyze a reaction, either directly on or above the substrate 126.

A window assembly is positioned within the processing chamber 200 to hold a first window, such as a UV vacuum window 212. The window assembly includes a vacuum window clamp 210 that may be directly or indirectly rested on a portion of the body 162 (FIG. 1) and supports a vacuum window 212 through which UV light may pass from the UV lamp bulbs 122. The vacuum window 212 is generally positioned between the UV radiation source, such as UV lamp bulbs 122, and the substrate support 124. A showerhead 214, which may be formed of various transparent materials such as quartz or sapphire, is positioned within the processing region 160 and between the vacuum window 212 and the substrate support 124. The transparent showerhead 214 forms a second window through which UV light may pass to reach the substrate 126. The transparent showerhead defines an upper processing region 220 between the vacuum window 212 and transparent showerhead 214 and further defines a lower processing region 222 between the transparent showerhead 214 and the substrate support, such as substrate support 124. The transparent showerhead 214 also has one or more passages 216 between the upper and lower processing regions 220, 222. The passages 216 may have a roughened internal surface for diffusing the UV light so there is no light pattern on the substrate 126 during processing. The size and density of the passages 216 may be uniform or non-uniform to effectuate the desired flow characteristics across the substrate surface. The passages 216 may have either a uniform flow profile where the flow per radial area across the substrate 126 is uniform or the gas flow can be preferential to the center or edge of the substrate 126, i.e. the gas flow may have a preferential flow profile.

The front and/or back surface of the transparent showerhead 214 and vacuum window 212 may be coated to have a band pass filter and to improve transmission of the desired wavelengths or improve irradiance profile of the substrate. For example, an anti-reflective coating (ARC) layer may be deposited on the transparent showerhead 214 and vacuum window 212 to improve the transmission efficiency of desired wavelengths. The ARC layer may be deposited in a way that the thickness of the reflective coating at the edge is relatively thicker than at the center region of the transparent showerhead 214 and vacuum window 212 in a radial direction, such that the periphery of the substrate disposed underneath the vacuum windows 212 and the transparent showerhead 214 receives higher UV irradiance than the center. The ARC coating may be a composite layer having one or more layers formed on the surfaces of the vacuum window 212 and transparent showerhead 214. The compositions and thickness of the reflective coating may be tailored based on the incidence angle of the UV radiation, wavelength, and/or the irradiance intensity. A more detailed description/benefits of the ARC layer is further described in the commonly assigned U.S. patent application Ser. No. 13/301,558 filed on Nov. 21, 2011 by Baluja et al., which is incorporated by reference in its entirety.

A gas distribution ring 224 made of aluminum oxide is positioned within the processing region 160 proximate to the sidewall of the UV chamber. The gas distribution ring 224 can be a single piece (not shown), or can include a gas inlet ring 223 and a base distribution ring 221 having one or more gas distribution ring passages 226. The gas distribution ring 224 is configured to generally surround the circumference of the vacuum window 212. The gas inlet ring 223 may be coupled with the base distribution ring 221 which together may define the gas distribution ring inner channel 228. A gas supply source 242 (FIG. 3) is coupled to one or more gas inlets (not shown) formed in a surface of the gas inlet ring 223 through which gas may enter the gas distribution ring inner channel 228. The one or more gas distribution ring passages 226 couple the gas distribution ring inner channel 228 with the upper processing region 220, forming a gas flow path between the inner channel 228 and the upper processing region 220 above the transparent showerhead 214.

A gas outlet ring 230 is positioned below the gas distribution ring 224 and may be at least partially below the transparent showerhead 214 within the processing region 160. The gas outlet ring 230 is configured to surround the circumference of the transparent showerhead 214 and having one or more gas outlet passages 236 coupling a gas outlet ring inner channel 234 and the lower processing region 222, forming a gas flow path between the lower processing region 222 and the gas outlet inner channel 234. The one or more gas outlet passages 236 of the gas outlet ring 230 are disposed at least partially below the transparent showerhead 214.

Figure 3:
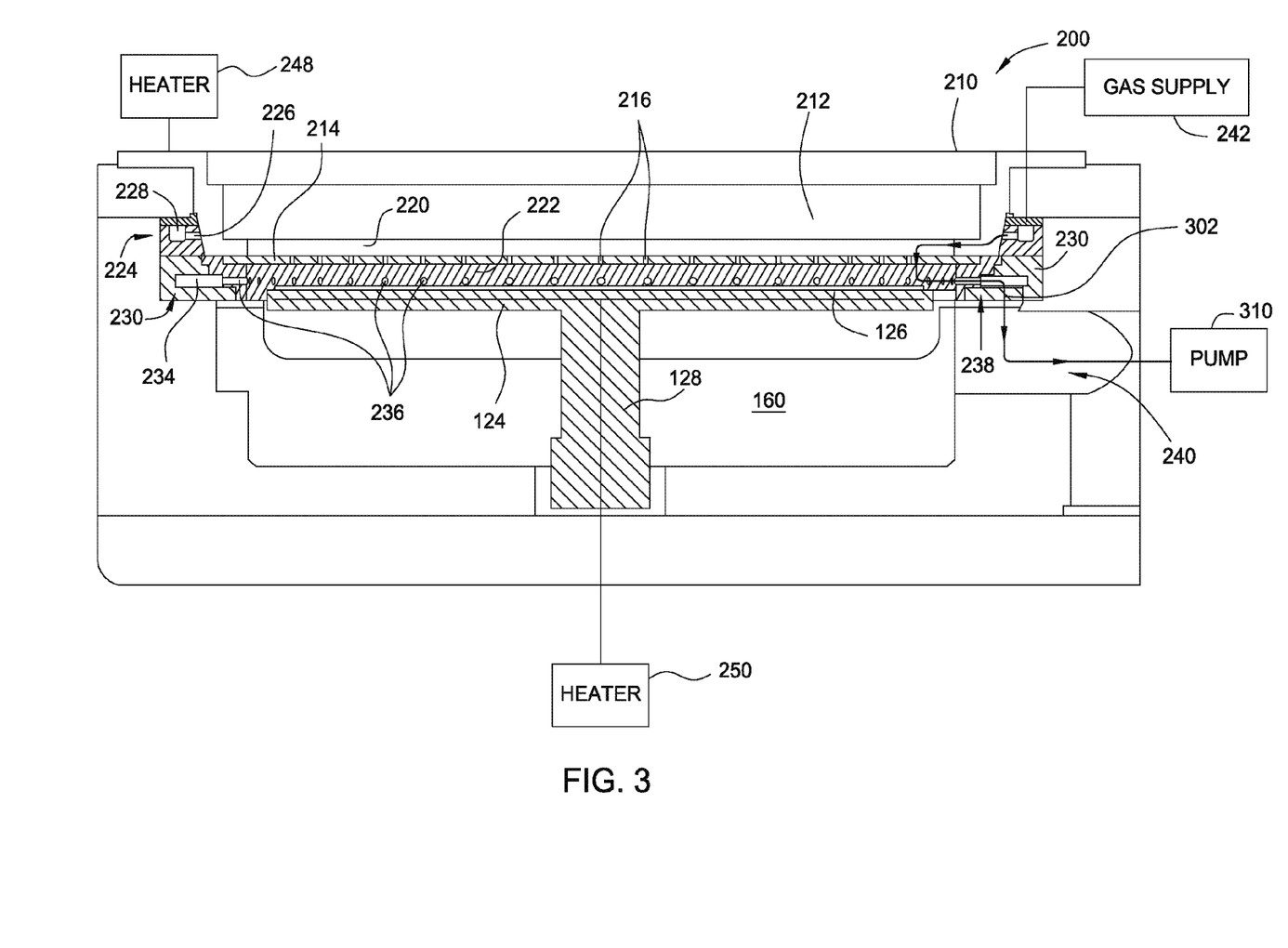
FIG. 3 is a schematic cross-sectional view of the processing chamber in FIG. 2 illustrating a gas flow path.

FIG. 3 depicts a schematic cross-sectional view of the processing chamber 200 in FIG. 2 illustrating a gas flow path. As indicated by arrow 302, a processing gas such as the pore sealing agent to be discussed below and/or other types of gases, may be injected into and evenly filled the upper processing region 220 between the vacuum window 212 and the transparent showerhead 214, through the transparent showerhead 214, over the substrate support 124 which may have a substrate 126 disposed thereon, down towards the substrate from the transparent showerhead 214. The gas flow washes over the substrate 126 from above, spreads out concentrically, and exits the lower processing region 222 through gas outlet passages 236. The gas then is ejected from the lower processing region 222, enters the gas outlet ring inner channel 234, and exits the gas outlet 238 into a gas exhaust port 240 and to a pump 310. Depending on the pattern of the passages 216 in the showerhead 214, the gas flow profile may be controlled across the substrate 126 to provide a desired uniform or non-uniform distribution. The processing chamber 200 is further described in the commonly assigned U.S. patent application Ser. No. 13/248,656 filed on Sep. 29, 2011 by Baluja et al., which is incorporated by reference in its entirety.

Exemplary Pore Sealing Process

Figure 4:
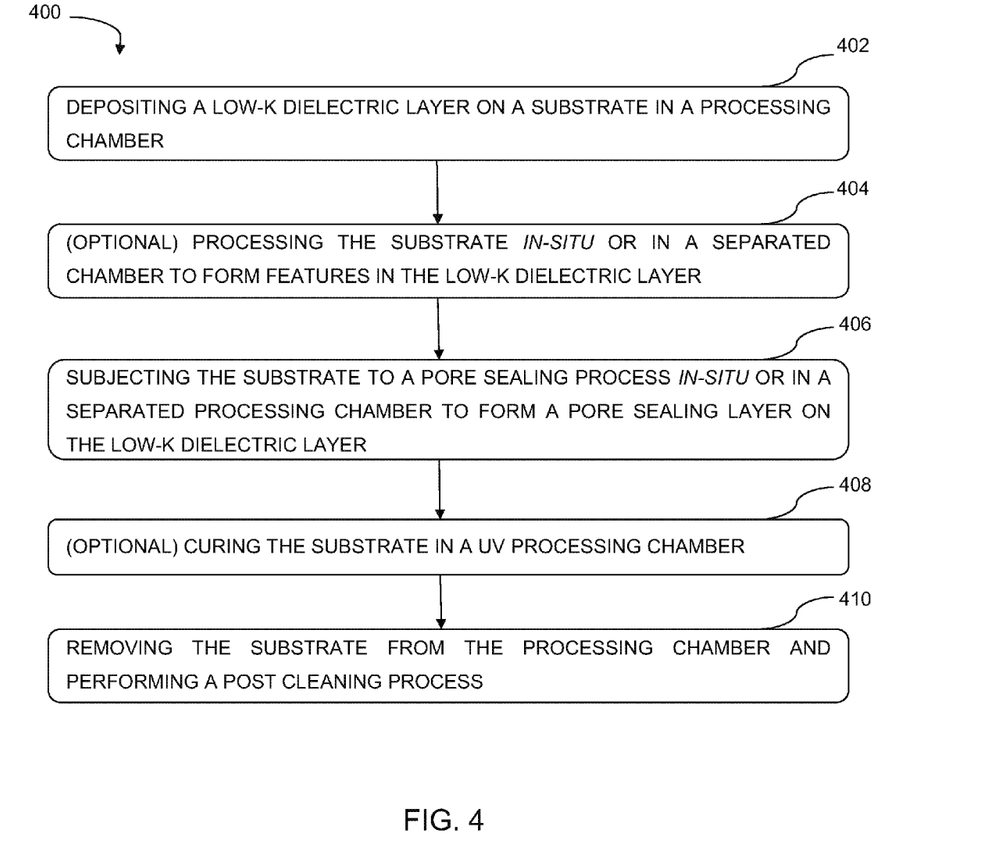
FIG. 4 is an exemplary process sequence for pore sealing of a damaged low-k film using a UV-assisted photochemical vapor deposition process in accordance with embodiments of the present invention.

FIG. 4 illustrates an exemplary process 400 for pore sealing of a damaged low-k film using a UV-assisted photochemical vapor deposition process in accordance with some embodiments of the present invention. The UV processing chamber may be any UV-based chamber such as the processing chambers 100, 200 shown in FIGS. 1 and 2. It should be noted that the sequence of steps illustrated in FIG. 4 are not intended to be limiting as to the scope of the invention described herein, since one or more steps may be added, deleted and/or reordered without deviating from the basic scope of the invention.

The process 400 starts with step 402 by depositing a low-k dielectric layer on a substrate in a processing chamber. The low-k dielectric layer may be any conventional porous, low-k, silicon based dielectric material having a k value below about 3. In one embodiment, the low-k dielectric layer is an organosilicate glass (OSG, such as SiCOH) which is a silicon oxide that contains carbon and hydrogen atoms. SiCOH may have a k value between about 2 and 3 and is available as Black Diamond II™ from Applied Materials. The low-k dielectric layer may have micro pores having diameters in the range of about 0.5 nm to about 20 nm. The low-k dielectric layer may be deposited by a plasma-enhanced chemical vapor deposition (PECVD) or any other suitable deposition technique.

In step 404, the substrate may be optionally processed in-situ or in a separated processing chamber to form features, such as vias and/or trenches, in the low-k dielectric layer using any suitable dry or wet etching process. Any masking materials and/or residues from the etching process which are left on the substrate may be stripped/removed in-situ or in a dedicated processing chamber using an ashing process or any other suitable technique.

In step 406, the substrate is subjected to a pore sealing process in-situ or in a separated processing chamber. In one embodiment, the pore sealing process is performed in a UV-based processing chamber, such as the processing chamber as discussed above with respective to FIGS. 1 and 2, by flowing a pore sealing agent into the processing chamber in a manner as described above with respect to FIG. 3. The pore sealing process is used to recover or repair at least some of the damages in the deposited low-k dielectric layer due to previous processes. During the pore sealing process, the substrate is exposed to the pore sealing agent, which may be in the form of a gas or a vaporized liquid vapor. The pore sealing agent may be flowed with a carrier gas such as He or Ar. In some embodiments, the pore sealing agent may be a non-silicon containing compound. In some embodiments, the pore sealing agent contains a compound with a general formula $C_xH_yO_z$, where x has a range of between 1 and 15, y has a range of between 2 and 22, and z has a range of between 1 and 3. Exemplary pore sealing agents may include but are not limited to dialkyl carbonates and alkyl acetates. Examples of dialkyl carbonates may include dimethyl carbonate ($C_3H_6O_3$), diethyl carbonate ($C_5H_{10}O_3$) or dipropyl carbonate ($C_7H_{14}O_3$), as shown below in Table 1. Examples of alkyl acetates may include propyl acetate ($C_5H_{10}O_2$), butyl acetate ($C_6H_{12}O_2$), methyl hexanoate ($C_7H_{14}O_2$), methyl heptanoate ($C_8H_{16}O_2$), methyl octanoate ($C_9H_{18}O_2$), or methyl decanoate ($C_{11}H_{22}O_2$), as shown below in Table 2.

TABLE 1

| Dimethyl carbonate | Diethyl carbonate | Dipropyl carbonate |
|---|---|---|
| H₃C–O–C(=O)–O–CH₃ | H₃C–CH₂–O–C(=O)–O–CH₂–CH₃ | H₃C–CH₂–CH₂–O–C(=O)–O–CH₂–CH₂–CH₃ |

TABLE 2

| Propyl acetate | Butyl acetate | Methyl hexanoate |
|---|---|---|
|  |  |  |
| Methyl heptanoate | Methyl octanoate | Methyl decanoate |
|  |  |  |

The pore sealing process may be performed in the UV-based processing chamber by flowing one or more pore sealing agents (listed in Table 1 and/or Table 2) toward the substrate through a UV transparent gas distribution showerhead from a region between a UV transparent window and the UV transparent gas distribution showerhead, for example the vacuum window 212 and the transparent showerhead 214 as discussed above with respect to FIGS. 2 and 3. The pore sealing process is performed with an UV unit turned on, such as UV lamp bulbs 122 shown in FIGS. 1 and 2, to assist dissociation of chemical bonds in the precursors of the pore sealing agent. The UV unit may be turned on while or after flowing the pore sealing agent into the processing chamber. Upon completion of the pore sealing process, a pore sealing layer or layer stack is formed on the porous low-k dielectric layer to seal the pores. The sealing layer or layer stack may have a thickness of about 10 Angstrom to about 50 Angstrom. Various exemplary embodiments are discussed below. It is understood that the process conditions described herein are based on a 300 mm diameter substrate.

In some embodiments, the pore sealing process is performed by flowing the pore sealing agent listed in Table 1 to the UV-based processing chamber. The processing time for the pore sealing process may be from about 15 seconds to about 900 seconds, for example about 360 seconds. During the pore sealing process, the chamber pressure may be between about 50 milliTorr and about 500 Torr, for example about 20 Torr. The substrate may be heated to a temperature of about 50° C. to about 400° C., for example between about 200° C. and about 350° C., such as about 300° C. The flow rate of the pore sealing agent may be between about 100 mgm and about 2000 mgm, for example about 800 mgm, and the flow rate of the carrier gas may be between about 500 sccm to about 5000 sccm, for example about 2000 sccm. The electrode spacing (i.e., a distance between the showerhead 214 and the substrate support 124) may be between about 400 mils to about 1400 mils, for example about 900 mils. The UV power may be between about 100 W/cm$^2$ and about 2000 W/cm$^2$, for example about 1200 W/cm$^2$. Exposing the low-k dielectric layer to the gaseous or vaporized dialkyl carbonates not only reacts with the damaged low-k film surface but the dialkyl carbonates also react themselves to form a network like thin film on the low-k film surface. The network like thin film can act as a sealing layer for the low-k dielectric layer and seal the pores on the porous low-k dielectric layer. In addition, higher temperature has been found to assist in moisture desorption from the damaged low-k dielectric layer and also improve the kinetics of the pore sealing reactions. Higher temperature is also believed to improve cross-linking within the damage layer to improve stability of the repair.

In some embodiments, the pore sealing process is performed by flowing the pore sealing agent listed in Table 2 to the UV-based processing chamber. The processing time for the pore sealing process may be from about 15 seconds to about 900 seconds, for example about 360 seconds. During the pore sealing process, the chamber pressure may be between about 50 milliTorr and about 500 Torr, for example about 20 Torr. The substrate may be heated to a temperature of about 50° C. to about 400° C., for example between about 200° C. and about 350° C., such as about 300° C. The flow rate of the pore sealing agent may be between about 100 mgm and about 2000 mgm, for example about 800 mgm, and the flow rate of the carrier gas may be between about 500 sccm to about 5000 sccm, for example about 2000 sccm. The electrode spacing (i.e., a distance between the showerhead 214 and the substrate support 124) may be between about 400 mils to about 1400 mils, for example about 900 mils. The UV power may be between about 100 W/cm$^2$ and about 2000 W/cm$^2$, for example about 1200 W/cm$^2$. Exposing the low-k dielectric layer to the gaseous or vaporized alkyl acetates is believed to form a long alkyl chain film on the damaged low-k film surface. The long alkyl chain film can act as a sealing layer for the low-k dielectric layer and seal the pores on the porous low-k dielectric layer.

In some embodiments, the pore sealing process is a two-step process using the pore sealing agents listed in Table 1 and Table 2. In one aspect, the pore sealing process may be performed by flowing one or more pore sealing agents listed in Table 1 to the UV-based processing chamber (step 1), followed by flowing one or more pore sealing agents listed in Table 2 to the UV-based processing chamber (step 2). Alternatively, the pore sealing process may be performed by flowing one or more pore sealing agents listed in Table 2 to the UV-based processing chamber (step 1), followed by flowing one or more pore sealing agents listed in Table 1 to the UV-based processing chamber (step 2). In either case, the process conditions of the step 1 and step 2 may be similar or identical to the embodiments described above with respect to flowing pore sealing agents listed in Table 1 or Table 2. The two-step process therefore forms a layer stack comprising a network like thin sealing film and a long alkyl chain sealing film on the low-k film surface. The effectiveness of the pore sealing is further enhanced as a result of the sealing layer stack.

Depending on film surface property, a transition step may be optionally performed between the step 1 and step 2 to re-treat the surface of the low-k dielectric layer. The transition step may be performed by flowing a catalyst gas to the UV-based processing chamber with the UV unit turned on to assist the surface treatment process. The catalyst gas may be a Lewis base amine, such as ammonia. The transition step generates surface hydroxyls which provide chemical reactive sites for subsequent precursors, such as the pore sealing agents listed in Table 1 or Table 2, thereby promoting the formation of network like thin film or long alkyl chain film on the low-k film surface. The transition step also helps convert a hydrophobic low-k dielectric layer surface to a hydrophilic low-k dielectric layer surface. This is because the exemplary SiCOH low-k dielectric layer may contain a hydrophobic low-k dielectric layer surface with hydrophilic functional groups after pattern etching or plasma ashing process. One exemplary hydrophilic functional groups are hydroxyl groups (—OH groups) that are formed after removal of —CH$_3$ groups from the SiCOH low-k dielectric layer due to the etch/strip plasmas and chemicals. By exposing the hydrophilic low-k dielectric layer surface to a catalyst gas containing a hydrophobic functional group, the hydrophilic functional groups can be substituted with the hydrophobic functional group from the catalyst gas, which may fill pores in the porous SiCOH low-k dielectric layer. As hydrophobic low-k dielectric layer surfaces are less likely to retain moisture than hydrophilic low-k dielectric layer surfaces, moisture cannot affect the properties of the treated low-k dielectric layer. Therefore, the k value of the low-k dielectric layer is restored (i.e., decreased).

During the transition step, the flow rate of the catalyst gas may be between about 50 sccm and about 2000 sccm, for example about 500 sccm. The UV power may be between about 100 W/cm$^2$ and about 2000 W/cm$^2$, for example about 500 W/cm$^2$. The two-step pore sealing process may be repeated, with or without the transition step performed between step 1 and step 2, until a desired thickness of the layer stack is formed. The resulting layer stack therefore comprises a network like thin sealing film and a long alkyl chain sealing film formed in an alternating order on the low-k film surface. In one embodiment, the layer stack may have a thickness of about 10 Angstrom to about 50 Angstrom.

In some embodiments, the pore sealing process is a one-step process using both pore sealing agents listed in Table 1 and Table 2. In one aspect, the pore sealing process may be performed by flowing one or more pore sealing agents listed in Table 1 and one or more pore sealing agents listed in Table 2 simultaneously or concurrently to the UV-based processing chamber. The processing time for the pore sealing process may be from about 15 seconds to about 900 seconds, for example about 360 seconds. During the pore sealing process, the chamber pressure may be between about 50 milliTorr and about 500 Torr, for example about 20 Torr. The substrate may be heated to a temperature of about 50° C. to about 400° C., for example between about 200° C. and about 350° C., such as about 300° C. The flow rate of the pore sealing agent listed in Table 1 may be between about 100 mgm and about 2000 mgm, for example about 800 mgm, and the flow rate of the pore sealing agent listed in Table 2 may be between about 100 mgm and about 2000 mgm, for example about 800 mgm. The flow rate of the carrier gas may be between about 500 sccm to about 5000 sccm, for example about 2000 sccm. The electrode spacing (i.e., a distance between the showerhead 214 and the substrate support 124) may be between about 400 mils to about 1400 mils, for example about 900 mils. The UV power may be between about 100 W/cm$^2$ and about 2000 W/cm$^2$, for example about 1200 W/cm$^2$. The pore sealing process forms a thin sealing layer on the low-k dielectric layer and seals the pores on the porous low-k dielectric layer.

In some embodiments, the pore sealing process is performed by flowing the pore sealing agent listed in Table 1 to the UV-based processing chamber, followed by a UV cure process. Alternatively, the pore sealing process may be performed by flowing the pore sealing agent listed in Table 2 to the UV-based processing chamber, followed by a UV cure process. The UV cure process may be performed without flowing of the pore sealing agent. In either case, the UV cure process uses UV energy from a UV unit to remove surface hydroxyls not reacted with dialkyl carbonate chemicals in the pore sealing agent and make the dielectric constant lower. The UV cure process also help maintains surface hydrophobicity after the UV-assisted photochemical vapor deposition process. In one aspect, the processing time for the pore sealing process may be from about 15 seconds to about 900 seconds, for example about 360 seconds. During the pore sealing process, the chamber pressure may be between about 50 milliTorr and about 500 Torr, for example about 20 Torr. The substrate may be heated to a temperature of about 50° C. to about 400° C., for example between about 200° C. and about 350° C., such as about 300° C. The flow rate of the pore sealing agent (either Table 1 or Table 2) may be between about 100 mgm and about 2000 mgm, for example about 800 mgm, and the flow rate of the carrier gas may be between about 500 sccm to about 5000 sccm, for example about 2000 sccm. The electrode spacing (i.e., a distance between the showerhead 214 and the substrate support 124) may be between about 400 mils to about 1400 mils, for example about 900 mils. The UV power may be between about 100 W/cm$^2$ and about 2000 W/cm$^2$, for example about 1200 W/cm$^2$.

During the UV cure process, the UV cure temperature may be from 100° C. to about 800° C., for example about 300° C. with a UV power of about 100 W/cm$^2$ to about 2000 W/cm$^2$. The UV cure time may be from about 15 seconds to about 600 seconds, for example about 120 seconds. A UV cure gas, such as helium and argon, may be flown to the processing chamber through the UV transparent gas distribution showerhead at a flow rate between about 0.5 slm to about 30 slm. The chamber pressure may be between about 3 Torr and about 100 Torr, for example about 20 Torr.

In step 408, the substrate is optionally cured in the same processing chamber for the pore sealing process (or a separated processing chamber) using UV energy from a UV unit disposed above the UV transparent gas distribution showerhead and the UV transparent window. In one embodiment, the UV cure temperature may be from 100° C. to about 800° C., for example about 300° C. with a UV power of about 100 W/cm$^2$ to about 2000 W/cm$^2$. The UV cure time may be from about 10 seconds to about 600 seconds, for example about 120 seconds. A UV cure gas, such as helium and argon, may be flown to the processing chamber through the UV transparent gas distribution showerhead at a flow rate between about 0.5 slm to about 30 slm. The chamber pressure may be between about 3 Torr and about 100 Torr, for example about 20 Torr.

In some embodiments where the pore sealing process involves the UV cure process, the pore sealing process in step 406 and UV curing in step 408 can be performed simultaneously. In such a case, the UV unit may turn on/off at the same time with the pore sealing process. In some embodiments, the UV cure in step 408 may be performed before pore sealing process in step 406. In some embodiments, the pore sealing process in step 406 and the UV cure in step 408 can be performed alternately. For example, the UV cure may be performed to remove some water from surface/side wall. The pore sealing process is then performed to seal the pores on the porous low-k dielectric layer and recover surface hydrophobicity. The UV cure is then performed to further recover low-k film damage. In such a case, the pore sealing process and the UV cure may be performed for about 15 to about 600 seconds, respectively. In one example, the first curing process may be about 60 seconds), the pore sealing process may be about 300 seconds), and the second curing process may be about 60 seconds. It is contemplated that the pore sealing agent flow rate, time, UV power, substrate temperature, chamber pressure of pore sealing process and UV cure process may vary depending upon the application and film properties such as changes in material composition (e.g., carbon depletion), morphology (density or porosity), and/or surface property (e.g., hydrophobic to hydrophilic). If desired, the UV curing may be performed in a separated processing chamber different than the processing chamber for the pore sealing process.

In step 410, upon completion of the optional UV curing, the substrate is removed from the processing chamber and a post cleaning process is performed within the processing chamber to remove any unwanted deposition build-up or residues from the exposed surfaces of the chamber components. The chamber components may refer to any components presented within the processing chamber that may have one or more surfaces exposed to the pore sealing agent or any other processing gas during the process. For example, the chamber components may include, but are not limited to the vacuum window 212, the transparent showerhead 214, the vacuum window clamp 210, the gas distribution ring 224, or the chamber walls etc. The post cleaning process may be performed in a UV-based processing chamber, such as the processing chamber as discussed above with respective to FIGS. 1 and 2, by flowing an oxygen-containing gas into the processing chamber in a manner as described above with respect to FIG. 3. The oxygen-containing gas may include, but is not limited to ozone ($O_3$) gas, oxygen ($O_2$) gas, nitrous oxide ($N_2O$), nitrogen monoxide (NO), carbon monoxide (CO), carbon dioxide ($CO_2$), or combinations thereof. In one embodiment, the oxygen-containing gas comprises ozone gas. In such a case, the post cleaning process is performed with the chamber components exposing to UV radiation to improve the efficiency of ozone degeneration. Production of the necessary ozone may be done remotely with the ozone transported to the processing chamber, generated in-situ by activating oxygen with UV light to create ozone, or accomplished by running these two schemes simultaneously.

During the post cleaning process, the UV radiation emitted from an UV unit, such as UV lamp bulbs 122 shown in FIGS. 1 and 2, breaks down the oxygen-containing gas, e.g., ozone, into molecular oxygen and reactive oxygen radicals, which oxidize/react with carbon-based residues (resulted from prior process such as the pore sealing process) formed on the exposed surfaces of the chamber components to produce carbon dioxide and water as the resulting products, thereby cleaning the chamber components. These resulting produces and decomposed residues are then pumped into the gas exhaust port 240 and to the pump 310 to complete the post cleaning process.

In order to improve the efficiency of the dissociation, additional heater such as heaters 248, 250 shown in FIG. 2 may be used to heat other components in the processing chamber such as the vacuum window clamp 210, the gas distribution ring 224, and the substrate support 124. In addition, as the chamber components were exposed to UV radiation and heated during the UV curing prior to the post cleaning process, the temperature of the chamber components is maintained at a temperature ready, or almost ready to substantially break down the ozone when it hits the chamber components. Therefore, the overall clean efficiency of the chamber components is enhanced.

In one embodiment, the oxygen-containing gas, such as ozone ($O_3$) gas, may be combined with a diluents gas such as oxygen gas or nitrogen gas. In such a case, the ozone/oxygen mixture may be combined with hydrogen gas to increase the oxidation rate. The hydrogen gas may be essentially pure hydrogen gas or a forming gas of $H_2/N_2$ having, for example, 7% hydrogen. In another embodiment, the oxygen-containing gas may be combined with helium gas. The helium gas is used as the heat transfer fluid to assist in heating the chamber components, such as the lower part of the transparent showerhead 214, thereby promoting clean efficiency of the chamber components.

Embodiments of the invention use a UV-assisted photochemical vapor deposition process to form a sealing layer on the porous low-k dielectric layer. The sealing layer seals the exposed pores on the porous low-k dielectric layer and thus reduces process-related damages caused by pattern etching or plasma ashing process. As a result, the dielectric constant of the low-k film is restored. Particularly, the pore sealing agent used to form the sealing layer contains a compound with a general formula $C_xH_yO_z$ and does not contain silicon. Accordingly, any deposition build-up or residues from the pore sealing agent can be easily removed from the exposed surfaces of the chamber components. Therefore, the UV source efficiency is enhanced.

While the foregoing is directed to embodiments of the invention, other and further embodiments of the invention may be devised without departing from the basic scope thereof.

The invention claimed is:

1. A method for processing a substrate in a processing chamber, comprising:
    exposing a dielectric layer formed on a substrate to a first pore sealing agent, wherein the first pore sealing agent contains a compound with a general formula $C_xH_yO_z$, where x has a range of between 1 and 15, y has a range of between 2 and 22, and z has a range of between 1 and 3;
    exposing the substrate to UV radiation in an atmosphere of the first pore sealing agent to form a first sealing layer on the dielectric layer; and
    exposing the substrate to a second pore sealing agent, wherein the second pore sealing agent is chemically different from the first pore sealing agent and contains a compound with a general formula $C_xH_yO_z$, where x has a range of between 1 and 15, y has a range of between 2 and 22, and z has a range of between 1 and 3, and wherein exposing the substrate to the second pore sealing agent is performed under exposure to UV radiation to form a second sealing layer over the first sealing layer.

2. The method of claim 1, wherein the first pore sealing agent and the second pore sealing agent are flowed concurrently or sequentially into the processing chamber.

3. The method of claim 1, further comprising:
    after forming the first sealing layer on the dielectric layer, exposing the first sealing layer to UV radiation in an atmosphere of a UV cure gas.

4. The method of claim 1, wherein the first and second pore sealing agents comprise the compound selected from the group consisting of dialkyl carbonates and alkyl acetates.

5. The method of claim 4, wherein the dialkyl carbonates comprise dimethyl carbonate ($C_3H_6O_3$), diethyl carbonate ($C_5H_{10}O_3$) or dipropyl carbonate ($C_7H_{14}O_3$).

6. The method of claim 4, wherein the alkyl acetates comprise propyl acetate ($C_5H_{10}O_2$), butyl acetate ($C_6H_{12}O_2$), methyl hexanoate ($C_7H_{14}O_2$), methyl heptanoate ($C_8H_{16}O_2$), methyl octanoate ($C_9H_{18}O_2$), or methyl decanoate ($C_{11}H_{22}O_2$).

7. The method of claim 1, further comprising:
    before exposing the dielectric layer to the second pore sealing agent, flowing a catalyst gas containing a hydrophobic functional group to the processing chamber under exposure to UV radiation.

8. A method for processing a substrate in a processing chamber, comprising:
- flowing a first pore sealing agent into an upper processing region of a processing chamber, wherein the upper processing region is located between a transparent window and a transparent showerhead positioned within the processing chamber, and the first pore sealing agent contains a compound with a general formula $C_xH_yO_z$, where x has a range of between 1 and 15, y has a range of between 2 and 22, and z has a range of between 1 and 3;
- flowing the first pore sealing agent from the upper processing region through one or more passages formed in the transparent showerhead into a lower processing region, wherein the lower processing region is located between the transparent showerhead and a substrate support located within the thermal processing chamber;
- exposing a dielectric layer formed on a substrate disposed on the substrate support to the first pore sealing agent;
- exposing the substrate to UV radiation in an atmosphere of the first pore sealing agent to form a first sealing layer on the dielectric layer; and
- exposing the dielectric layer formed on the substrate to a second pore sealing agent by flowing the second pore sealing agent into the upper processing region of the processing chamber and through the one or more passages formed in the transparent showerhead and into the lower processing region, wherein the second pore sealing agent is chemically different from the first pore sealing agent and contains a compound with a general formula $C_XH_yO_z$, where x has a range of between 1 and 15, y has a range of between 2 and 22, and z has a range of between 1 and 3, and wherein exposing the dielectric layer to the second pore sealing agent is performed under exposure to UV radiation to form a second sealing layer over the first sealing layer.

9. The method of claim 8, wherein the first pore sealing agent and the second pore sealing agents are flowed concurrently or sequentially into the processing chamber.

10. The method of claim 8, wherein the first and second pore sealing agents comprise the compound selected from the group consisting of dialkyl carbonates and alkyl acetates.

11. The method of claim 10, wherein the dialkyl carbonates comprise dimethyl carbonate ($C_3H_6O_3$), diethyl carbonate ($C_5H_{10}O_3$) or dipropyl carbonate ($C_7H_{14}O_3$).

12. The method of claim 10, wherein the alkyl acetates comprise propyl acetate ($C_5H_{10}O_2$), butyl acetate ($C_6H_{12}O_2$), methyl hexanoate ($C_7H_{14}O_2$), methyl heptanoate ($C_8H_{16}O_2$), methyl octanoate ($C_9H_{18}O_2$), or methyl decanoate ($C_{11}H_{22}O_2$).

13. The method of claim 8, wherein the flowing a first and a second pore sealing agents into the upper processing region further comprises:
- flowing the first and/or second pore sealing agents radially from a gas distribution ring configured to surround a circumference of the transparent window to one or more passages formed in the transparent showerhead.

14. The method of claim 13, further comprising:
- ejecting the first and/or second pore sealing agents radially from the lower processing region into a gas outlet ring configured to surround a circumference of the transparent showerhead.

15. The method of claim 8, further comprising:
- after forming the first sealing layer on the dielectric layer, exposing the first sealing layer to UV radiation in an atmosphere of a UV cure gas.

16. A method for processing a substrate in a processing chamber, comprising:
- exposing a dielectric layer formed on a substrate to a first pore sealing agent;
- exposing the dielectric layer to a second pore sealing agent that is chemically different from the first pore sealing agent, wherein the first and second pore sealing agents comprise a compound selected from the group consisting of dialkyl carbonates and alkyl acetates;
- exposing the substrate to UV radiation in an atmosphere of the first and/or second pore sealing agents to form a sealing layer on the dielectric layer; and
- after forming the sealing layer on the dielectric layer, exposing the sealing layer to UV radiation in an atmosphere of a UV cure gas.

17. The method of claim 16, further comprising:
- before exposing the dielectric layer to the second pore sealing agent, flowing a catalyst gas containing a hydrophobic functional group to the processing chamber under exposure to UV radiation.

18. The method of claim 16, wherein the dialkyl carbonates comprise dimethyl carbonate ($C_3H_6O_3$), diethyl carbonate ($C_5H_{10}O_3$) or dipropyl carbonate ($C_7H_{14}O_3$) and the alkyl acetates comprise propyl acetate ($C_5H_{10}O_2$), butyl acetate ($C_6H_{12}O_2$), methyl hexanoate ($C_7H_{14}O_2$), methyl heptanoate ($C_8H_{16}O_2$), methyl octanoate ($C_9H_{18}O_2$), or methyl decanoate ($C_{11}H_{22}O_2$).

* * * * *